United States Patent
Bains

(10) Patent No.: US 10,902,890 B2
(45) Date of Patent: Jan. 26, 2021

(54) METHOD, APPARATUS AND SYSTEM FOR A PER-DRAM ADDRESSABILITY MODE

(75) Inventor: Kuljit S. Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 543 days.

(21) Appl. No.: 13/531,368

(22) Filed: Jun. 22, 2012

(65) Prior Publication Data

US 2013/0346684 A1   Dec. 26, 2013

(51) Int. Cl.
*G06F 12/00* (2006.01)
*G11C 7/10* (2006.01)
*G11C 11/4096* (2006.01)

(52) U.S. Cl.
CPC ............ *G11C 7/1045* (2013.01); *G11C 7/109* (2013.01); *G11C 11/4096* (2013.01)

(58) Field of Classification Search
CPC .... G11C 11/4096; G11C 7/109; G11C 7/1045
USPC ..................................................... 711/1–200
See application file for complete search history.

(56) References Cited

U.S. PATENT DOCUMENTS

| | | | |
|---|---|---|---|
| 7,349,277 B2 | 3/2008 | Kinsley et al. | |
| 7,872,892 B2 | 1/2011 | MacWilliams et al. | |
| 2004/0128433 A1 | 7/2004 | Bains | |
| 2005/0041500 A1 | 2/2005 | Lee | |
| 2005/0259506 A1 | 11/2005 | Roohparvar | |
| 2007/0013704 A1* | 1/2007 | MacWilliams | G06F 13/1684 345/542 |
| 2011/0047319 A1* | 2/2011 | Jeon | G06F 13/4243 711/103 |
| 2011/0063931 A1* | 3/2011 | Linam | G06F 13/1689 365/193 |
| 2011/0138261 A1* | 6/2011 | Bains et al. | 714/800 |
| 2011/0235459 A1 | 9/2011 | Ware et al. | |
| 2012/0239960 A1* | 9/2012 | Priel et al. | 713/400 |
| 2013/0339821 A1* | 12/2013 | Cordero | G06F 11/1666 714/773 |

(Continued)

FOREIGN PATENT DOCUMENTS

| | | |
|---|---|---|
| WO | 2013109284 A1 | 7/2013 |
| WO | 2013/191911 A1 | 12/2013 |

OTHER PUBLICATIONS

Kinsley, Tom "DDR4 Module Level Trends and Features" Micron Technology, Server Memory Forum 2011, JEDEC, 31 pages.*

(Continued)

*Primary Examiner* — David Yi
*Assistant Examiner* — Zubair Ahmed
(74) *Attorney, Agent, or Firm* — Compass IP Law PC

(57) ABSTRACT

Techniques and mechanisms for programming an operation mode of a dynamic random access memory (DRAM) device. In an embodiment, a memory controller stores a value in a mode register of a DRAM device, the value specifying whether a per-DRAM addressability (PDA) mode of the DRAM device is enabled. An external contact of the DRAM device is coupled to the memory controller device via a signal line of a data bus. In another embodiment, the memory controller sends a signal to the external contact while the PDA mode of the DRAM device is enabled, the signal to specify whether one or more features of the DRAM device are programmable.

40 Claims, 9 Drawing Sheets

(56) References Cited

U.S. PATENT DOCUMENTS

2013/0346684 A1 12/2013 Bains

OTHER PUBLICATIONS

DDR3 SDRAM Standard JESD79-F Jul. 2010 JEDEC www.jedec.org.*
Wikipedia—From Google type DDR4 Wikipedia—From Google type LPDDR4.*
Kinsley "DDR4 Module Level Trends and Features" supplied as a NPL by the Applicant.*
JEDEC DDR3 SDRAM Standard JESD79-3F Jul. 2010 www.jedec.org.*
JEDEC DDR4 Mini Workshop "Server Memory Forum 2011" www.jedec.org.*
"Understanding and Measuring the Latest Bit Error Rate Based AC Timings in DDR4 and GDDR5" Mar. 1 2012 www.jedec.org.*
"Migrating to LPDDR3" in LPDDR3 Symposium 2012 www.jedec.org.*
Kinsley, "DDR4 Module Level Trends and Features", supplied as a non-patent literature by the Applicant.*
JEDEC DDR3 SDRAM Standard JESD79-3F Jul. 2010 available at www.jedec.org.*
JEDEC DDR4 Mini Workshop, Server Memory Forum 2011, available at www.jedec.org.*
Perry Keller, "Understanding and Measuring the Latest Bit Error Rate Based AC Timings in DDR4 and GDDR5", Mar. 1 2012 in http://www.jedec.org/events-meetings/server-memory-forum-shenzhen/agenda.*
"Migrating to LPDDR3" in LPDDR3 Symposium 2012 in www.jedec.org/sites/default/files/Frank_Ross_LPDDR3.pdf.*
Kinsley, "DDR4 Module Level Trends and Features", supplied as NPL by the Applicant.*
JEDEC DDR3 SDRAM Standard JESD79-3F, Jul. 2010.*
JEDEC DDR4 Mini Workshop, Server Memory Forum 2011.*
Server Memory Forum.*
Kinsley, Tom, "DDR4 Module Level Trends and Features; Micron Technology, JEDEC, Server Memory Forum 2011", (2011), 31 pgs.
International Search Report received for PCT Patent Application No. PCT/US2013/044340, dated Sep. 13, 2013, 5 pages.
Examination Report for German Patent Application No. GB1420667.6 dated May 17, 2016, 3 pages.
Examination Report for German Patent Application No. GB1420667.6 dated Oct. 26, 2015, 5 pages.
Examination Report for German Patent Application No. GB1420667.6 dated Oct. 31, 2016, 3 pages.
JEDEC DDR4 Standard, Sep. 2012.
English Translation of the Notice of Preliminary Rejection, Application No. 10-2014-7030987, dated Oct. 31, 2016, 4 pages.
Kibong Koo, etc al., A 1.2V 38nm 2.4Gb/s/pin 2Gb DDR4 SDRAM with Bank Group and ×4 Half-Page Architecture, ISSCC 2012 / Session 2 / High Bandwidth DRAM & PRAM / 2.2, Digest of Technical Papers, 2012 IEEE International Solid-State Circuits Conference, 2 pages.
English Translation of the Notice of Last Preliminary Rejection, Patent Application No. 10-2014-7030987, dated Aug. 10, 2017, 2 pages.

* cited by examiner

METHOD, APPARATUS AND SYSTEM FOR A PER-DRAM ADDRESSABILITY MODE

BACKGROUND

1. Technical Field

Embodiments relate generally to programming a dynamic random access memory (DRAM) device. More particularly, certain embodiments provide mechanisms to set a mode of operation of a DRAM device.

2. Background Art

In a conventional memory system of a computer or other such hardware platform, control of a rank of memory devices is provided by a memory controller, where a command bus and/or other interconnect couples the memory controller to each of the DRAM devices of the rank. Typically, such a command bus provides to each of the DRAM devices one or more command signals for a command issued by the memory controller. In response, each of the DRAM devices of the rank detects, and performs a respective execution for, the provided command signals.

As the design and fabrication of memory system circuit logic continues to improve, memory systems become increasingly sensitive to operational inefficiencies. Consequently, there is a growing push for more precise configuration of operational parameters for memory devices. However, the opportunities to provide more precision in such configuration are limited in memory rank applications. For example, the architecture of a conventional memory rank—where DRAM devices of the rank share a command bus, address bus, chip select and/or the like—results in every DRAM device of the rank responding to a command from the memory controller. Consequently a command to change an operational parameter of one DRAM device of a rank will, for example, also change the operational parameter of every other DRAM device of that rank.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
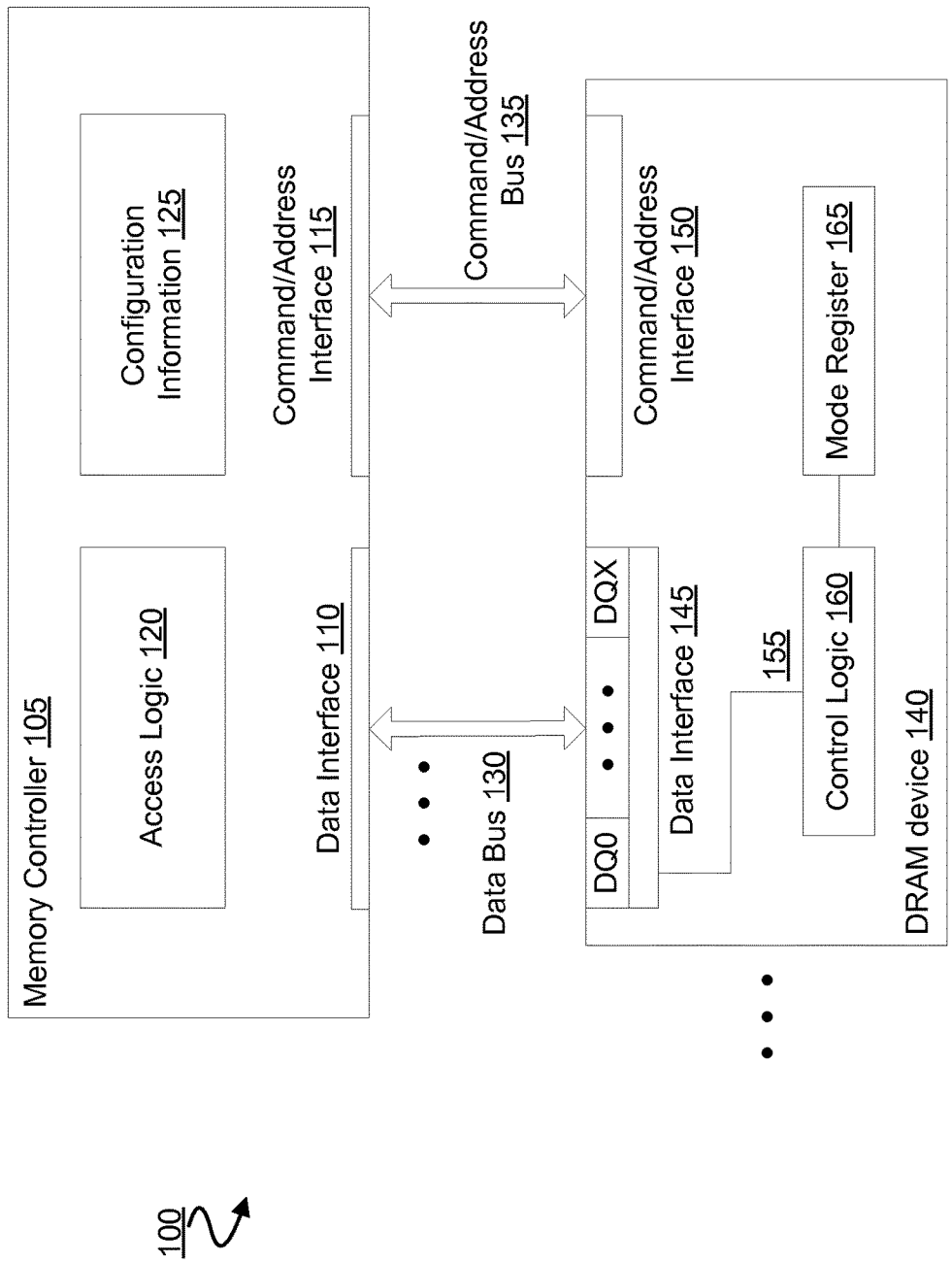
FIG. 1 is a block diagram illustrating elements of a memory system for accessing memory resources according to an embodiment.

Embodiments variously provide for a per-DRAM addressability (PDA) mode of a DRAM device. While a PDA mode is enabled on a DRAM device, the device may be independently programmed by a memory controller on a device-specific basis—e.g. independent of any programming of one or more other memory devices of a rank which includes that DRAM device. Such programming may, for example, include setting one or more Mode Register Values of the DRAM device—e.g. to configure a reference voltage (Vref) value, an on-die termination (ODT) value and/or the like. Before entering PDA mode, a DRAM device may require write leveling, although certain embodiments are not limited in this regard.

The most recent draft of the DDR4 specification of the Joint Electron Devices Engineering Council (JEDEC) allows for inclusion of device-specific programmability in a rank of DRAM devices. While a DRAM device has a PDA mode enabled, execution of one or more mode register set (MRS) commands may be qualified based on some contact of a data interface, such as DQ0, or other dedicated external contact of the DRAM device. By way of illustration and not limitation, a DRAM device with PDA enabled may capture DQ0 by using one or more data strobe signals—e.g. differential data strobe signals DQS_c and DQS_t. If the DRAM device determines that a value on DQ0 represents a particular logic state—e.g. low (or "0")—then the DRAM device may select to execute the associated MRS command. Alternatively, if the DRAM device determines that the value on DQ0 represents some different logic state—e.g. high (or "1")—then the DRAM device may select to ignore the associated MRS command. A memory controller controlling such a DRAM device may choose to drive all the DQ bits—e.g. to selectively program some or all DRAM devices in a rank while such devices have respective PDA modes enabled. In an embodiment, only MRS commands are allowed to be executed while a DRAM device has PDA mode enabled.

A PDA mode of a DRAM device may be enabled, for example, by storing some designated value to one or more bits of a mode register—e.g. by setting a bit A4 of a mode register MR3 to "1". Alternatively or in addition, such a PDA mode may be disabled by storing a different designated value to said one or more bits of the mode register—e.g. by setting bit A4 of that same mode register MR3 to "0"—in conjunction with contact DQ0 of that DRAM device receiving some signal (such as logic "0") to enable the storing. The organization of one such mode register—e.g. MR3—according to one embodiment is illustrated in Table 1 below:

TABLE 1

| Mode Register for Specifying PDA Mode | | |
|---|---|---|
| Address | Operating Mode | Description |
| BG1 | RFU | 0 = Must be programmed to 0 during MRS |

TABLE 1-continued

Mode Register for Specifying PDA Mode

| Address | Operating Mode | Description | |
|---|---|---|---|
| BG0, BA1:BA0 | MR Select | 000 = MR0 | 100 = MR4 |
| | | 001 = MR1 | 101 = MR5 |
| | | 010 = MR2 | 110 = MR6 |
| | | 011 = MR3 | 111 = MR7 |
| A13 | RFU | 0 = Must be programmed to 0 during MRS | |
| A12:A11 | MPR Read Format | 00 = Serial | 10 = Staggered |
| | | 01 = Parallel | 11 = Reserved |
| A10:A9 | Write CMD Latency when DM are enabled | | |
| A8:A6 | Fine Granularity Refresh Mode | | |
| A5 | Temp sensor readout | 0 = disabled | 1 = enabled |
| A4 | Per DRAM Addressability | 0 = disabled | 1 = enabled |
| A3 | Geardown Mode | 0 = ½ Rate | 1 = ¼ Rate |
| A2 | MPR Operation | 0 = Normal | 1 = Dataflow from/to MPR |
| A1:A0 | MPR page Selection | 00 = Page0 | 10 = Page2 |
| | | 01 = Page1 | 11 = Page3 |

In an embodiment, removing a DRAM device from PDA mode may require programming an entire mode register—e.g. MR3—of the DRAM device with a MRS command. This may impact some per-DRAM addressability values programmed within a rank as the exit command is sent to the rank. In order to avoid such an impact, a PDA Enable/Disable Control bit of a DRAM device may be located in a mode register that does not also have one or more other PDA mode controls. In per DRAM addressability mode, a DRAM device may capture DQ0 using DQS_t and DQS_c like normal write operation. However, dynamic ODT may not be supported, for example. So extra care may be required for the ODT setting. If RTT_NOM MR1 {A10:A9:A8}=Enable, DDR4 SDRAM data termination may need to be controlled by an ODT pin, where such control is constrained by one or more timing parameters in Table 2 below.

TABLE 2

Applied ODT Timing Parameter to PDA Mode

| Symbol | Parameter |
|---|---|
| DODTLon | Direct ODT turn on latency |
| DODTLoff | Direct ODT turn off latency |
| tADC | RTT change timing skew |
| tAONAS | Asynchronous RTT_NOM turn-on delay |
| tAOFAS | Asynchronous RTT_NOM turn-off delay |

Since a PDA mode may be used to program an optimal Vref for a DRAM device, the DRAM device may, prior to such programming, incorrectly read a DQ level at a first edge of a data strobe signal DQS and/or a last falling edge of DQS. To reduce the chance of such an error, the DRAM device may sample DQ0 on either the first falling or second rising DQS edges. This may enable a common implementation between BC4 and BL8 modes on the DRAM device. The memory controller controlling the DRAM device may be required to drive DQ0 to a 'Stable Low or High' during the length of the data transfer for one or both of BC4 and BL8 cases.

FIG. 1 illustrates elements of a memory system 100 for accessing memory resources according to an embodiment. Memory system 100 may be part of a hardware platform including, but not limited to, any of a variety of desktop computers, laptop computers, handheld devices (e.g. a tablet, smart phone, palmtop and/or the like), servers, network access points, routers or other networking devices, gaming consoles, smart TVs, digital video recorders, video cameras, set-top boxes and/or the like. In an embodiment, memory system 100 includes a DRAM device 140 to store data and a memory controller 105 to control DRAM device 140. Memory controller 105 and DRAM device 140 may couple to one another via one or more interconnects of memory system 100—e.g. to facilitate an exchange of data signals, command signals, address signals and/or the like.

By way of illustration and not limitation, memory system 100 may include a data bus 130 coupled between a data interface 110 of memory controller 105 and a data interface 145 of DRAM device 140. Additionally or alternatively, 100 may include command/address bus 135 coupled between a command/address interface 115 and a command/address interface 150 of DRAM device 140. Any of a variety of additional or alternative interconnects may couple memory controller 105 and DRAM device 140, according to different embodiments. Command/address bus 135 may be comprised of multiple component buses—e.g. a dedicated address bus and a dedicated command bus—although certain embodiments are not limited in this regard. For example, command/address interface 115 may be comprised of multiple component interfaces—e.g. a dedicated address interface and a dedicated command interface—each to couple to a respective one of such component buses. Alternatively or in addition, command/address interface 150 may be comprised of multiple component interfaces—e.g. a dedicated address interface and a dedicated command interface—each for a respective one of such component buses.

DRAM device 140 may include logic to operate as a synchronous DRAM (SDRAM), although certain embodiments are not limited in this regard. In an embodiment, some or all data, command and/or address communications between memory controller 105 and DRAM device 140 may be compliant with an interface specification such as a double data rate (DDR) synchronous dynamic random-access memory (SDRAM) specification. For example, memory controller 105 and DRAM device 140 may be according to the latest draft—as of the date of this filing—of the DDR4 SDRAM specification of the Joint Electron Devices Engineering Council (JEDEC).

One or more control signal lines (not shown) may further couple memory controller 105 to DRAM device 140. By way of illustration and not limitation, memory controller 105 to DRAM device 140 may be further coupled to one another by one or more of a clock signal line, a data strobe signal line, a chip select signal line, an on-die termination signal line and/or any of a variety of additional or alternative control signal lines. In one or more operation modes of DRAM device 140, some or all of such control signals lines may provide for control of DRAM device 140 according to conventional techniques.

DRAM device 140 may include circuit logic to provide for various modes of operation of DRAM device 140. For example, DRAM device 140 may include a mode register 165 comprising one or more register bits (not shown) to store a value specifying whether a particular mode of DRAM device 140 is enabled. DRAM device 140 may further include control logic 160 to operate based on the value stored in such one or more bits of mode register 165. By way of illustration and not limitation, control logic 160 may determine, in response to a value being stored in mode register 165, whether DRAM device 140 is to execute, or forego execution of, a command received by DRAM device 140 from memory controller 105.

In an embodiment, memory controller 105 includes access logic 120 to configure DRAM device 140 for operation in a particular operation mode. For example, access logic 120 may issue a mode register set (MRS) command, or other such communication, to write to the one register or more bits of mode register 165. Memory controller 105 may further include, or otherwise have access to, configuration information 125 describing, for example, a current operation mode of DRAM device 140. In an embodiment, access logic 120 is to further exchange data signals, address signals, command signals, control signals and/or the like with DRAM device 140, where such exchange is based on a current operation mode of DRAM device 140.

In an embodiment, operation in a first mode may result in DRAM device 140 selecting between executing a received command and foregoing execution of that received command, where the selection is conditioned upon whether a signal is received at some first external contact of DRAM device 140. The first operation mode may be distinguished, for example, from a second operation mode which would result in DRAM device 140 executing a received command independent of whether such a signal is received at that first external contact. As used herein, "external contact" (or, for brevity, simply "contact") refers to any of a variety of pins, balls, pads and/or other such electrical contact hardware.

Such an external contact may, for example, be a contact of data interface 145 to couple DRAM device 140 to data bus 130. By way of illustration and not limitation, data interface 145 may include external contacts DQ0, ..., DQX, each of which is to couple to a respective signal line of data bus 130. In such an embodiment, control logic 160 may receive a signal 155 representing a signal received at a particular one of DQ0, ..., DQX—e.g. a signal received at DQ0—where such signal is a condition for determining whether to execute an associated command.

In an illustrative scenario of one embodiment, mode register 165 may, at some point in time, store a value specifying a first operation mode for input 155 to be at least one basis for control logic 160 selecting between executing a received command and foregoing execution of that received command. Such a first operation mode may be termed a "data dependent execution mode", for example. Alternatively or in addition, mode register 165 may at some other time store another value specifying a second operation mode for control logic 160 to signal or allow execution of a received command independent of any particular signal being provided as input 155. Such a second operation mode may be termed a "data agnostic execution mode", for example.

As discussed herein, a data dependent execution mode may allow for DRAM device 140 to operate in a rank of DRAM devices—e.g. where, while DRAM device 140 is in the data dependent execution mode, input 155 may serve as an analog of an addressing signal to address DRAM device 140 specifically from among the multiple DRAM devices. Accordingly, such a data dependent execution mode is also referred to herein as a per-DRAM addressability (PDA) mode.

Figure 2:
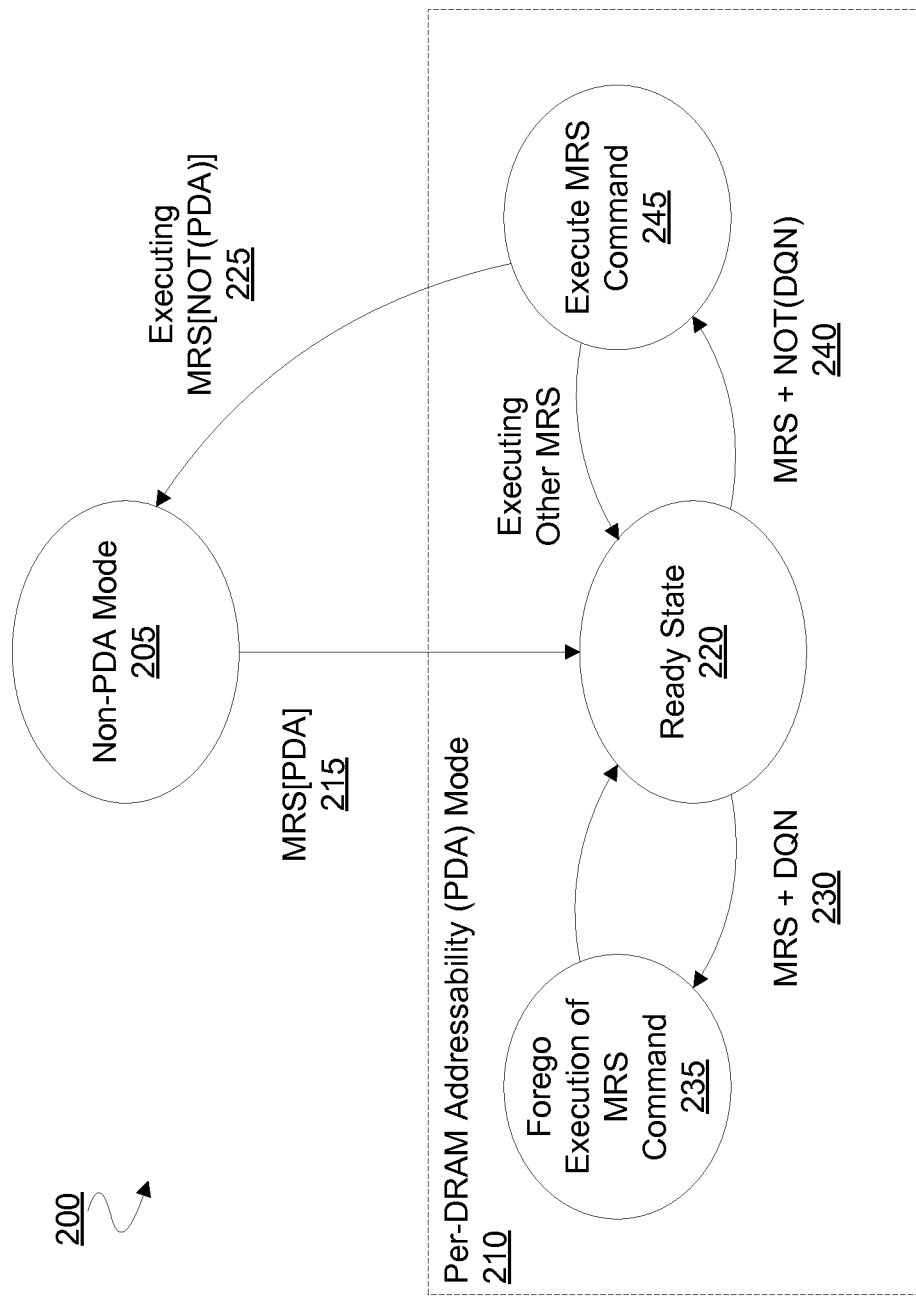
FIG. 2 is a flow diagram illustrating elements of a method for transitioning a memory device between operation modes according to an embodiment.

FIG. 2 illustrates elements of a method 200 for transitioning a memory device between operation modes according to an embodiment. Method 200 may be implemented by a DRAM device having some or all of the features of DRAM device 140. For example, method 200 may be performed in response to one or more exchanges between such a DRAM device and a memory controller having some or all of the features of memory controller 105.

Alternatively, method 200 may be implemented by a memory controller to control such a DRAM device. For example, method 200 may represent the various sending of communications from a memory controller having some or all of the features of memory controller 105. Such communications may include a command sent to the DRAM device to store in a mode register a value specifying whether a per-DRAM addressability (PDA) mode of the DRAM device is enabled. Such communications may further include sending a signal, while the PDA mode of the DRAM device is enabled, to an external contact of the DRAM device which is coupled to the memory controller device via a signal line of a data bus. Such a signal may specify to the DRAM device the programmability of one or more features of the DRAM device. The signal may, for example specify—i.e. on a DRAM device-specific basis—whether a command sent in conjunction with the signal is capable of programming the one or more DRAM device features.

In an embodiment, method 200 includes a non-PDA mode 205 of the DRAM device. As discussed with reference to DRAM device 140, non-PDA mode 205 may include a configuration of the DRAM device for execution of a received command which is independent of whether a signal is received at a particular contact—e.g. a data bus input—of the DRAM device in association with the command. By contrast, a PDA mode 210 may include an alternate configuration for the DRAM device to select between executing such a received command and foregoing execution of that received command, where the selection is conditioned upon whether such a signal is received at that particular input of the DRAM device.

To illustrate certain features of various embodiments, non-PDA mode 205 and PDA mode 210 are described herein with respect to the DRAM device processing commands of a particular command type—i.e. a mode register set (MRS) command type. However, non-PDA mode 205 and PDA mode 210 may additionally or alternatively apply to the DRAM device processing commands of one or more other command types. In an embodiment, while in non-PDA mode 205, the DRAM device may execute all commands of at least a particular command type—e.g. all MRS commands—which are received at the DRAM device. For example, while in non-PDA mode 205, the DRAM device may be configured to execute all commands which it receives.

At some point, the DRAM device may, while in non-PDA mode 205, execute a mode register set command MRS [PDA] 215 which transitions the DRAM device from non-PDA mode 205 to PDA mode 210. For example, execution of MRS[PDA] 215 may write to a mode register of the DRAM device a value specifying that PDA mode 210 is enabled.

In an embodiment, execution of MRS[PDA] 215 initially puts the DRAM device into a ready state 220 of PDA mode 210. During ready state 220, the DRAM device may be configured to detect for the receiving of any command of a command type to which PDA mode 210 applies—e.g. to detect for any MRS command received from the memory controller. In response to detecting such a command while in PDA mode 210, the DRAM device may select between executing the received command and foregoing such execution. Such selection may be conditioned, for example, upon whether a particular input of the DRAM device receives a particular signal in association with the received command.

By way of illustration and not limitation, the DRAM device may detect the receiving of a set of signals MRS+ DQN 230 from the memory controller. The set of signals MRS+ DQN 230 may, for example, include one or more command signals for an MRS command and a particular signal—e.g. a logic high ("1") signal—which is asserted, in association with the one or more command signals, on a data interface contact DQN of the DRAM device. Various signals of MRS+ DQN 230 may be received by the DRAM device at different times, although certain embodiments are not limited in this regard. In response to detecting MRS+ DQN 230, the DRAM device may transition to a state 235 to forego execution of the MRS command indicated by MRS+ DQN 230. For example, the DRAM device flush information associated with the MRS command without any execution of the MRS command, and return to ready state 220.

Alternatively or in addition, the DRAM device may detect the receiving of a set of signals MRS+NOT(DQN) 240 from the memory controller. The set of signals MRS+NOT(DQN) 240 may, for example, include one or more command signals for an MRS command and another particular signal—e.g. a logic low ("0") signal—which is asserted, in association with the one or more command signals, on the same contact DQN. Various signals of MRS+NOT(DQN) 240 may be received by the DRAM device at different times, although certain embodiments are not limited in this regard. In response to detecting MRS+NOT(DQN) 240, the DRAM device may transition to a state 245 for execution of the MRS command indicated by MRS+NOT(DQN) 240.

The MRS command indicated by MRS+NOT(DQN) 240 may be a command MRS[NOT(PDA)] 225, execution of which transitions the DRAM device from state 245 of PDA mode 210 to non-PDA mode 205. For example, execution of MRS[NOT(PDA)] 225 may write to a mode register of the DRAM device a value specifying that non-PDA mode 205 is enabled. Alternatively, the DRAM device may execute some other MRS command, which does not change the PDA mode 210 of the DRAM device, and transition from state 245 to ready state 220.

Figure 3:
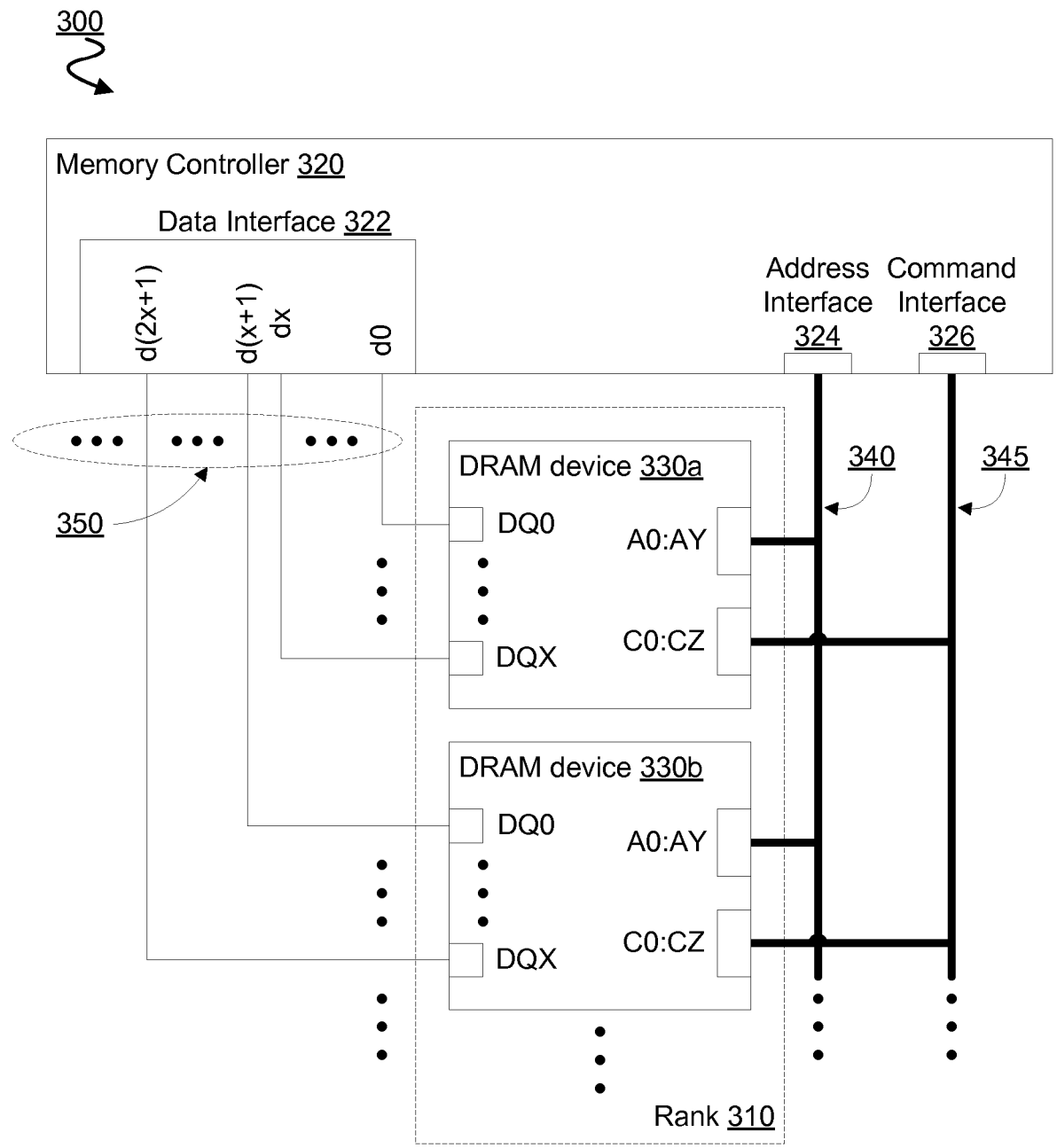
FIG. 3 is a block diagram illustrating elements of a system for operating a rank of memory devices according to an embodiment.

FIG. 3 illustrates elements of a memory system 300 for accessing memory resources according to an embodiment. In an embodiment, memory system 300 includes some or all of the features of memory system 100. For example, memory system 300 may include a memory controller 320 having some or all of the features of memory controller 105. Alternatively or in addition, memory system 300 may include a DRAM device 330a and a DRAM device 330b which each variously include some or all of the features of DRAM device 140.

Memory controller 320 may be variously coupled to DRAM devices 330a, 330b via one or more interconnects of memory system 300—e.g. to facilitate an exchange of data signals, command signals, address signals, control signals and/or the like. Interconnection of memory controller 320 to DRAM devices 330a, 330b may be for operation of DRAM devices 330a, 330b in a rank 310 of DRAM devices.

For example, memory system 300 may include a data bus 350 including a plurality of data signal lines to variously connect DRAM device 330a and DRAM device 330b each to a data interface 322 of memory controller 320. By way of illustration and not limitation, data bus 350 may couple contacts d0, . . . , dx of data interface 322 each to a respective one of data contacts DQ0, . . . , DQX of DRAM device 330a. Additionally or alternatively, data bus 350 may couple contacts d(x+1), . . . , d(2x+1) of data interface 322 each to a respective one of data contacts DQ0, . . . , DQX of DRAM device 330b. Any of a variety of additional or alternative interconnect arrangements may couple data interface 322 to DRAM devices 330a, 330b, according to different embodiments. Alternatively or in addition, data interface 322 may include one or more additional contacts (not shown) to variously couple to one or more other DRAM devices of rank 310.

Memory system 300 may further include an address bus 340 to couple an address interface 324 of memory controller 320 both to address contacts A0:AY of DRAM device 330a and to address contacts A0:AY of DRAM device 330b. Alternatively or in addition, memory system 300 may include a command bus 345 to couple a command interface 326 of memory controller 320 both to command contacts C0:CZ of DRAM device 330a and to command contacts C0:CZ of DRAM device 330b.

DRAM devices of rank 310 may each include respective logic to implement various operation modes. For example, a first mode of one such DRAM device may provide for that DRAM device to select between executing a received command and foregoing execution of that received command, where the selection is conditioned upon whether a particular signal is provided in association with the received command via a particular contact—e.g. a data contact—of the DRAM device. In an embodiment, a second mode of that DRAM device may provide for the DRAM device to execute a received command regardless of whether the particular signal is provided in association with the command via that particular contact.

To illustrate features of certain embodiments, such a first mode is discussed herein with respect to respective external contacts DQ0 of DRAM devices 330a, 330b. However, features of the first mode may, in different embodiments, be implemented with some other contact—e.g. another one of contacts DQ0, . . . , DQX—of the respective DRAM devices 330a, 330b.

In an embodiment, DRAM device 330a may, while operating in the first mode, condition execution of a command received from command interface 326 upon whether a particular signal is provided on DQ0 in association with the received command. For example, DRAM device 330a may execute a received command in response to detecting a first logical state is signaled via its DQ0 or, alternatively, forego execution of the received command in response to detecting that a different logical state is signaled via its DQ0.

Such a first operation mode may, for example, provide for per-DRAM addressability within rank 310 of memory system 300. By way of illustration and not limitation, memory controller 320 may configure DRAM devices 330a, 330b to each operate in a respective PDA mode. For example, memory controller 320 may store to respective mode registers of DRAM devices 330a, 330b values which are each to specify that the PDA mode is enabled.

While both DRAM devices 330a, 330b operate in a PDA mode, memory controller 320 may issue a command—e.g. including sending command signals via command bus 345 to each of DRAM devices 330a, 330b. In association with sending such command signals, memory controller 320 may further send one or more signals via data bus 350 each to a respective one of DRAM devices 330a, 330b.

In their respective PDA modes, DRAM devices 330a, 330b may evaluate signals received via their respective DQ0 contacts—e.g. where such DQ0 contacts each serve as an addressing analog for the corresponding one of DRAM devices 330a, 330b to independently determine whether that DRAM device is to perform some execution for the command signals received from command interface 326.

In an illustrative embodiment, memory controller to 320 may send respectively signals via contacts d0, d(x+1) of data interface 322 to the respective DQ0 contacts of DRAM devices 330a, 330b. Such signals may result in neither of DRAM devices 330a, 330b, only one of DRAM devices 330a, 330b or both of DRAM devices 330a, 330b performing some execution for the command signals which DRAM devices 330a, 330b each receive from command interface 326.

Figure 4:
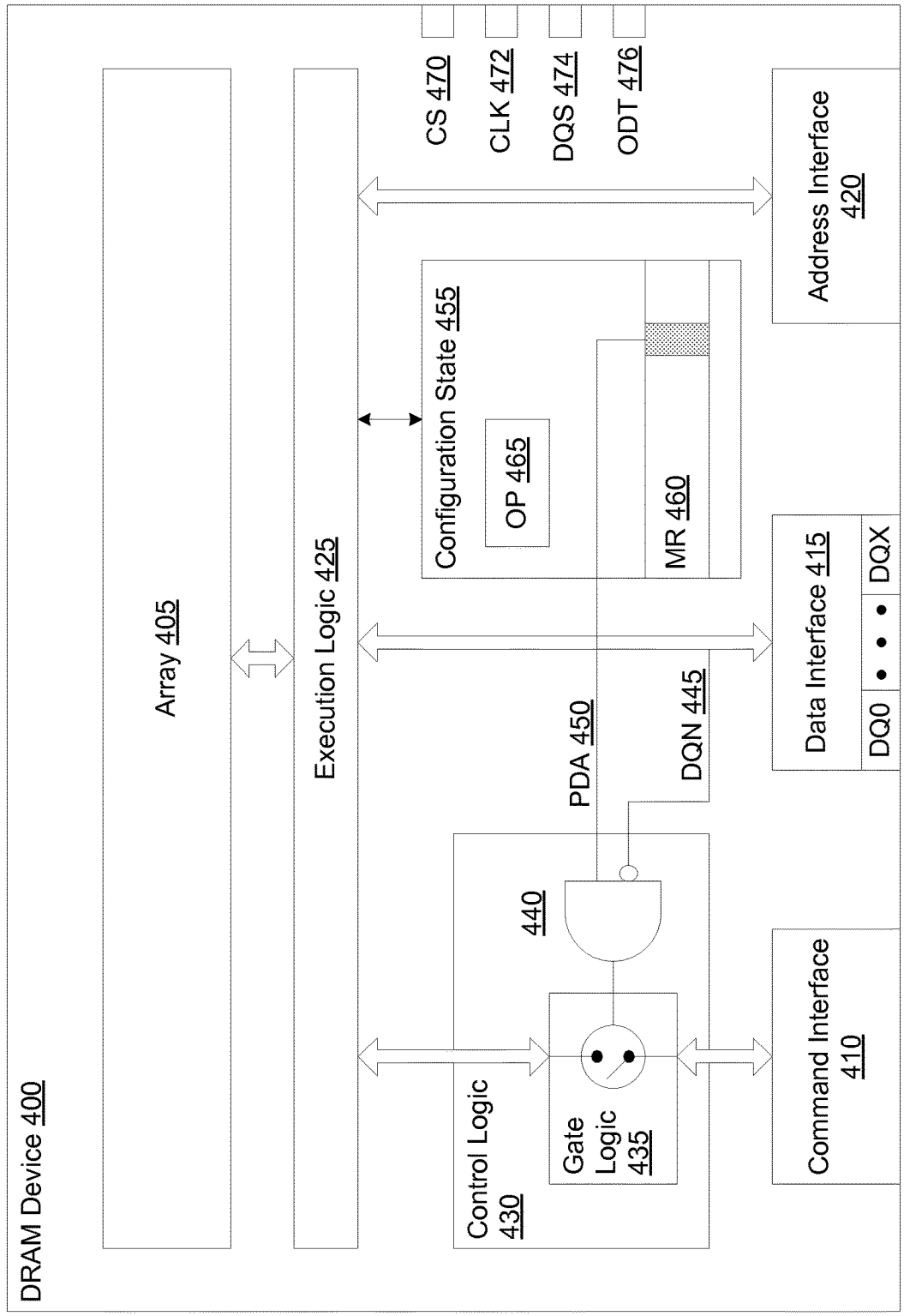
FIG. 4 is a block diagram illustrating elements of a DRAM device for implementing an operation mode according to an embodiment.

FIG. 4 illustrates elements of a DRAM device 400 for determining whether to implement a PDA mode according to an embodiment. DRAM device 400 may include some or all of the features of one of memory devices 300a, 300b, for example. In an embodiment, DRAM device 400 is a SDRAM device. Alternatively or in addition, DRAM device 400 may include logic to operate as a DDR memory device—e.g. a low power DDR (LPDDR) device. For example, DRAM device 400 may be a DDR4 SDRAM device and/or a LPDDR4 SDRAM device.

In an embodiment, DRAM device 400 includes an array 405 of memory cells to store data, the array 405 arranged in rows and columns (not shown). DRAM device 400 may further include one or more interfaces for interconnecting DRAM device 400 with a memory controller to provide such a memory controller with access to array 405.

By way of illustration and not limitation, DRAM device 400 may include a command interface 410 to exchange command signals with a memory controller via a command bus. Alternatively or in addition, DRAM device 400 may include an address interface 420 to exchange address signals with the memory controller via an address bus. Alternatively or in addition, DRAM device 400 may include a data interface 415 to exchange data and/or other signals with the memory controller via a data bus. In an illustrative embodiment, data interface 415 includes external electrical contacts DQ0, . . . , DQX (e.g. including pins, balls, pads and/or the like) to couple to one or more signal lines of such a data bus.

In an embodiment, DRAM device 400 further includes one or more external contacts for an exchange of control signals. By way of illustration and not limitation, DRAM device 400 may include a chip select contact CS 470 to receive a chip select signal for enabling operation of DRAM device 400, and/or a clock signal contact CLK 472 (or alternatively, a pair of differential CLK contacts) to receive a clock signal for regulating operation of DRAM device 400. Alternatively or in addition, DRAM device 400 may include a data strobe contact DQS 474 (or alternatively, a pair of differential DQS contacts) to receive a data strobe signal for indicating when data is being sent on a data bus, and/or an on-die termination contact ODT 476 to receive a signal indicating an impedance matching to apply for one or more signal lines of an IC of DRAM device 400. DRAM device 400 may include any of a variety of additional or alternative external contacts for control signaling, according to different embodiments.

DRAM device 400 may include execution logic 425 for accessing array 405 to execute at least in part a command indicated by command information received via command interface 410. In an embodiment, execution logic 425 includes circuitry which, in one or more operation modes of DRAM device 400, is to access memory cells those array 405 according to conventional techniques. By way of illustration and not limitation, execution logic 425 may include one or more of decoder logic (e.g. a row decoder, column decoder, etc.) buffers, sense amplifiers and/or any of a variety of mechanisms to read, write, erase, refresh or otherwise access memory cells of array 405.

DRAM device 400 may further include control logic 430 which, in one or more operation modes of DRAM device 400, is to qualify whether an access of array 405 by execution logic 425 is to take place for servicing executing some command issued by the memory controller. Some or all of control logic 430 may be incorporated into execution logic 425, although certain embodiments are not limited in this regard. Control logic 430 may operate based at least in part on a state of enablement of a PDA current mode of DRAM device 400. Such enablement may be specified in configuration state 455 stored in DRAM device 400—e.g. by a value PDA 450 which, for example, the memory controller stores in a mode register 460 of configuration state 455. While DRAM device 400 is in a PDA mode, control logic 430 may determine whether execution logic 425 is to receive and operate on, or be prevented from receiving and/or operating on, command signals received via command interface 410. Such determining may, for example, be based on whether a particular signal is received via a particular external contact of DRAM device 400 in association with the command signals.

Control logic 430 is a high level representation of logic according to one embodiment for implementing PDA mode functionality. However, control logic 430 may include any of a variety of additional or alternative circuit logic to implement such functionality. In the illustrative embodiment, control logic 430 includes gate logic 435 for selectively gating, switching, latching or otherwise passing command signals (or preventing such passing) from command interface 410 to execution logic 425. Control logic 430 may further include combinatorial logic 440—represented by an illustrative AND gate—to selectively signal whether gate logic 435 is to allow or prevent such passing of command signals. In an embodiment, combinatorial logic 440 may signal that gate logic 435 is to pass all command signals to execution logic 425 whenever input PDA 450 is equal to a value indicating a PDA mode is not enabled. Alternatively or in addition, when input PDA 450 is equal to a value indicating that the PDA mode is enabled, signaling of combinatorial logic 440 for gate logic 435 to pass command signals may be further based on whether a signal is received at some external contact of DRAM device—e.g. a signal DQN 445 from an external contact of data interface 415—in association with the received command signals. In an embodiment, DQN 445 represents a signal received at DQ0.

In the illustrative embodiment, PDA 450 is a single bit which is input directly to combinatorial logic 440 and DQN 445 is logically inverted at an input of combinatorial logic 440. However, any of a variety of additional or alternative inputs may be provided to combinatorial logic 440. For example, PDA 450 may alternatively comprise multiple bits which combinatorial logic 440 is to compare to a predetermined value corresponding to a particular PDA mode type (or to a particular non-PDA mode type). Alternatively or in addition, combinatorial logic 440 may be an uninverted input—e.g. where the passing of command signals to execution logic 425 is indicated to combinatorial logic 440 by DQN 445 representing a high (e.g. "1" or "true") logic state.

While a PDA mode is enabled, control logic 430 may selectively allow or prevent programmability of one or more features of DRAM device 400. By way of illustration and not limitation, during such a PDA mode, programmability of some operation state OP 465 may be conditioned, at least in part, upon control logic 430 detecting a particular logic state of DQN 445. In response to detecting based on DQN 445 that OP 465 is to be programmable, control logic 430 may signal execution logic 425 to process command signals—e.g. to execute another MRS command—for changing a value of OP 465. By way of illustration and not limitation, execution logic 425 may change a resistance value to be associated with a particular on-die termination setting, a voltage level to be associated with some voltage reference Vref and/or any of a variety of additional or alternative configurations of DRAM device 400.

Figure 5:
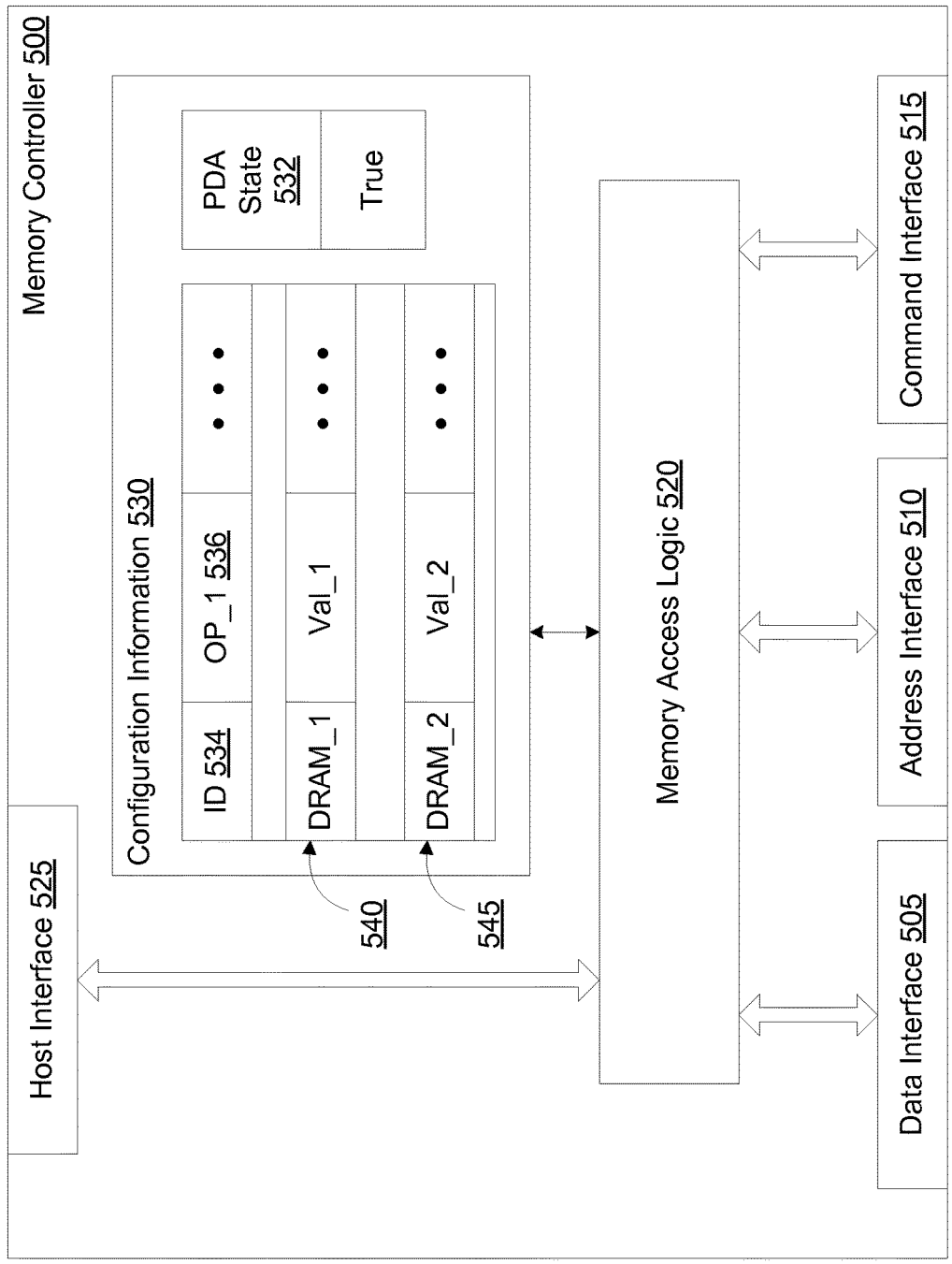
FIG. 5 is a block diagram illustrating elements of a memory controller for accessing a DRAM device according to an embodiment.

FIG. 5 illustrates elements of a memory controller 500 for accessing a DRAM memory device according to an embodiment. Memory controller 500 may include some or all of the features of memory controller 105, for example.

Memory controller 500 may include a host interface 525—e.g. for exchanging communications with one or more host processors of a hardware platform on which memory controller 500 is to operate. In an embodiment, memory controller 500 is to access a DRAM device on behalf of such a host processor—e.g. where the DRAM device includes some or all of the features of DRAM device 400. The DRAM device may be one of a rank of DRAM devices controlled by memory controller 500, although certain embodiments are not limited in this regard.

Memory controller 500 may include one or more interfaces for exchanging commands signals, address signals, data signals and/or control signals with such a DRAM device. By way of illustration and not limitation, memory controller 500 may include one or more of a data interface 505 for coupling to a data bus, address interface 510 for coupling to an address bus and a command interface 515 for coupling to a command bus. Memory controller 500 may further include one or more external contacts (not shown) for communicating respective control signals with a DRAM device—e.g. where such control signals include one or more of CS, CLK, DQS, ODT and/or other such control signals.

In an embodiment, memory controller 500 includes memory access logic 520 to access one or more resources of the DRAM device. For example, memory access logic 520 may include command and control circuitry to exchange command, address, data and/or control signals with the DRAM device—e.g. to variously program one or more features of the DRAM device, to access a memory array of the DRAM device and/or the like. Memory access logic 520 may configure the DRAM device for operation in a PDA mode. For example, memory access logic 520 may issue a MRS command to store in one or more mode register bits of the DRAM device a value specifying that a PDA mode is enabled.

Memory access logic 520 may further issue another command while the PDA mode of the DRAM device is enabled—e.g. the other command to program one or more features of the DRAM device. Such programming of the one or more features of the DRAM device may include memory controller 500 asserting a signal on a particular external contact of data interface 505—e.g. where the signal is to be evaluated by the DRAM device as a condition for selecting whether to execute the other command or to forego execution of that other command.

To facilitate such programming of the DRAM device, memory controller 500 may include one or more registers or other such storage media to store configuration information 530 which describes current state of one or more DRAM devices. For example, configuration information 530 may include PDA state 532 to store a value (e.g. a Boolean value "True" or "False") specifying whether one or more DRAM devices controlled by memory controller 500 are currently in a PDA mode. Additionally or alternatively, configuration information 530 may store, for each of one or more DRAM devices controlled by memory controller 500, a respective set of information describing one or more operational parameter values of that DRAM device.

By way of illustration and not limitation, configuration information 530 may store a first set of information 540 for a device DRAM_1 and/or a second set of information 545 for a device DRAM_2. An identifier field ID 534 of the first set of information 540 may store an identifier for DRAM_1, and/or ID 534 of the second set of information 545 may store an identifier for DRAM_2. Alternatively or in addition, an operation parameter field OP_1 536 of the first set of information 540 may identify that an operation parameter OP_1 for DRAM_1 is configured for a value Val_1, and/or OP_1 536 of the second set of information 545 may identify that operation parameter OP_1 for DRAM_2 is configured for a value Val_2. Memory controller 500 may include any of a variety of additional or alternative configuration information, according to different embodiments.

Enabling respective PDA modes of DRAM_1 and DRAM_2 allows memory access logic 520 to issue a MRS command signals which DRAM_1 is to execute and which DRAM_2 is to ignore—e.g. signals for an MRS command to set OP_1 to value Val_1. Alternatively or in addition, memory access logic 520 may issue a MRS command signals which DRAM_1 is to ignore and which DRAM_2 is to execute—e.g. signals for an MRS command to set OP_1 to value Val_2. The selective execution of such MRS commands each by only one or DRAM_1 and DRAM_2 may, for example, be based upon memory access logic 520 sending via data interface 505 one signal to an external contact DQN of DRAM_1 and a different signal to a corresponding external contact DQN of DRAM_2.

Figure 6:
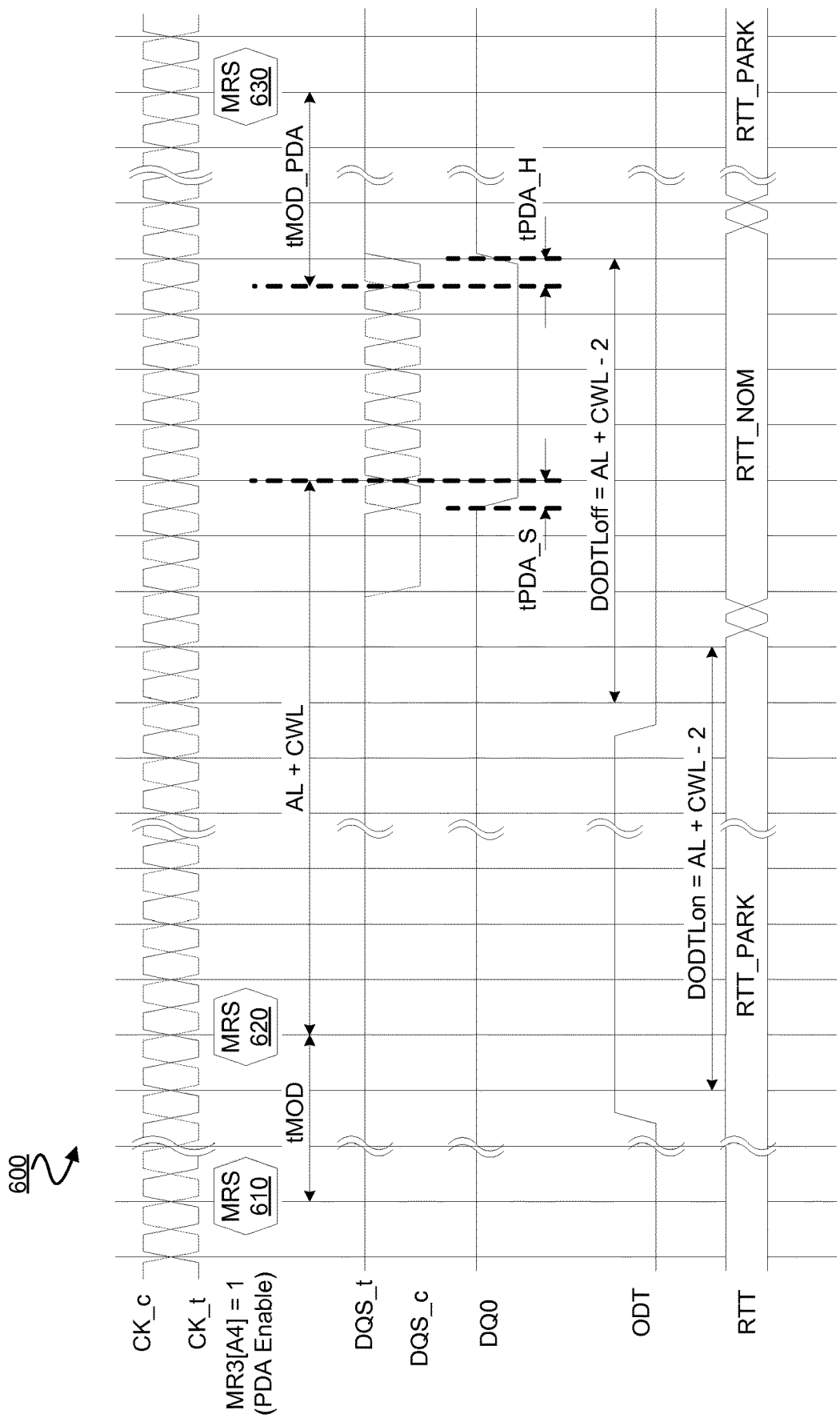
FIG. 6 is a timing diagram illustrating elements of exchanges to program a DRAM device according to an embodiment.

FIG. 6 illustrates elements of a timing diagram 600 for programming a DRAM device according to an embodiment. Timing diagram 600 may represent an illustrative exchange between memory controller 105 and DRAM device 140, for example. In an embodiment, exchanges in timing diagram 600 put the DRAM device into a PDA mode and selectively access the DRAM device while it is in the PDA mode.

To illustrate certain features of different embodiments, timing diagram 600 shows a particular set of signals in relation to a differential clock signal comprising component clock signals CK_c, CK_t. For example, timing diagram 600 includes differential data strobe signals DQS_t and DQS_c with which the memory controller indicates to the DRAM device when valid signals are being asserted on a data bus.

Timing diagram 600 further includes an input signal provided at an external contact DQ0 of the DRAM device. In the illustrative embodiment represented by timing diagram 600, the DRAM device, when in the PDA mode, evaluates the input signal at DQ0 as a condition for selecting between executing a command and foregoing execution of that command. Timing diagram 600 further includes an on-die termination control signal ODT with which the memory controller indicates to the DRAM device when to implement a particular impedance matching—e.g. to facilitate a signal exchange in a particular direction on one or more interconnects. For example, an impedance matching state RTT of the DRAM device, represented in timing diagram 600, may be variously changed in response to ODT.

Timing diagram 600 further includes sets of signals MRS 610, MRS 620 and MRS 630 which are each associated with a different respective mode register set command issued by the memory controller. For example, the set of signals MRS 610 may include command signals with which the memory controller describes a corresponding command to the DRAM device. MRS 610 may further include one or more address signals and/or control signals associated with such command signals—e.g. where such address signals and/or control signals facilitate the DRAM device processing of the command signals of MRS 610. By way of illustration and not limitation, MRS 610 may further include one or more of a row address select (RAS) signal, column address select (CAS) signal, a write enable (WE) signal and/or the like. Similar signals may be variously included in one or both of MRS 620 and MRS 630.

In an illustrative scenario, MRS 610 indicates a mode register set command to configure the DRAM device for operation in a PDA mode. By way of illustration and not limitation, the DRAM device may include a mode register (such as a mode register MR3) having a dedicated bit (such as a bit A4) for configuring per-DRAM addressability. MRS command 610 may write to MR3[A4] a value—e.g. a logical "1" value—to specify that PDA is enabled at the DRAM device. MRS 610 may specify the value to be stored in MR3[A4] with an address signal from the memory controller, although certain embodiments are not limited in this regard.

After issuing MRS 610 to enable the PDA mode of the DRAM device, the memory controller may prepare for programming one or more features of the DRAM device. Such programming may be specific to the DRAM device or, for example, specific to only a subset of DRAM devices in a rank which includes that DRAM device. By way of illustration and not limitation, the ODT signal may be asserted in conjunction with MRS 610 to initiate a transition the DRAM device from some parked impedance matching configuration RTT_PARK to some nominal impedance matching configuration RTT_NOM which facilitates the reading of signals provided to the DRAM device via a data bus. In an embodiment, assertion of the ODT signal is timed based on a direct ODT turn on latency DODTLon which, for example, accounts for an additive latency AL and a column address strobe write latency CWL. For example, DODTLon may be equal to 2 clock cycles less than the sum of AL and CWL.

Programming of the DRAM device in the PDA mode may include the memory controller issuing MRS 620—e.g. only after some minimum delay tMOD (e.g. ~4 clock cycles) required between successive MRS commands. The memory controller may provide one or more additional signals via the data bus to facilitate executing of the command indicated by MRS 620. Memory controller may—e.g. after a delay of AL+CWL—begin cycling differential data strobe signals DQS_c, DQS_t to indicate to the DRAM device that one or more data bus lines carry valid signals which are relevant to processing the command indicated by MRS 620. Since it is in PDA mode, the DRAM device may, in response to DQS_c, DQS_t, evaluate DQ0 as a condition for determining whether to execute the command indicated by MRS 620, or forego such execution. If the DRAM device is meant to perform such execution, the memory controller may assert a signal—e.g. logic low ("0")—to indicate such on a data bus signal line which couples to external contact DQ0 of the DRAM device. The asserted signal of DQ0 may serve as an analog for addressing the DRAM device which, for example, enables programmability of one or more features of the DRAM device. The asserting of the signal on DQ0 may be timed to account for a latency tPDA_S in DQ0 settling low before DQS_t and DQS_c are to be polled by the DRAM device. In an embodiment, the DRAM device completes its transition from RTT_PARK to RTT_NOM in time for the DRAM device to read signals of DQ0 and any other data bus signal line coupled to the DRAM device.

In the example of timing diagram 600, the memory controller operates in a burst length eight (8) mode, where data bus signals associated with the command for MRS 620 are provided over eight cycles of CK_c, CK_t. The memory controller may prepare in advance for the end of such eight cycles—e.g. where the ODT signal is deasserted for the DRAM device to transition back from RTT_NOM to RTT_PARK. Deasserting the ODT signal may, for example, be timed to account for a direct ODT turn off latency DODTLoff. DODTLoff may, for example, be equal to 2 clock cycles less than the sum of AL and CWL, although certain embodiments are not limited in this regard. Alternatively or in addition, DQ0 may be deasserted in time for it to reach a logic high just at the end of the eight clock cycles. For example, deassertion of DQ0 may be timed to account for a latency tPDA_H in DQ0 rising to logic high.

After receiving data bus signals for the command of MRS 620, the DRAM device may execute the command—e.g. to program one or more features of the DRAM device. For example, execution of the command for MRS 620 may write to one or more mode registers of the DRAM device to associate a resistance value with an on-die termination setting, to associate a voltage value with a Vref parameter and/or the like. The memory controller may subsequently issue MRS 630 of some next MRS command for the DRAM device to process—e.g. after some minimum delay tMOD_PDA before the next MRS command may be sent.

Figure 7:
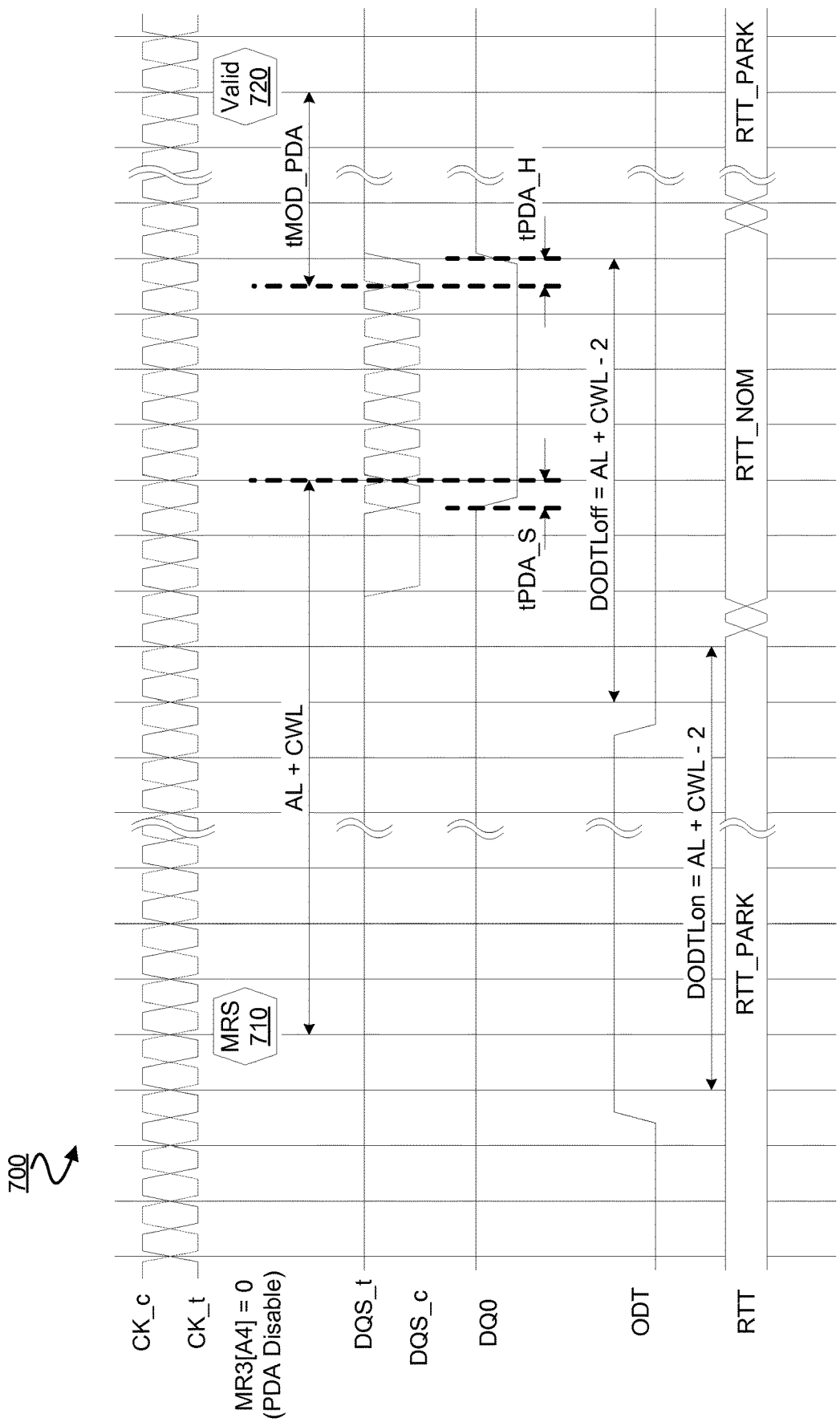
FIG. 7 is a timing diagram illustrating elements of exchanges to program a DRAM device according to an embodiment.

FIG. 7 illustrates elements of a timing diagram 700 for programming a DRAM device according to an embodiment. Timing diagram 700 may represent an illustrative exchange between memory controller 105 and DRAM device 140, for example. In an embodiment, exchanges in timing diagram 700 are performed by a memory system which also performs the exchanges in timing diagram 600.

To illustrate certain features of different embodiments, timing diagram 700 shows signals—e.g. differential clock signals CK_c, CK_t, differential data strobe signals DQS_t and DQS_c, DQ0 signal, ODT signal and RTT state—which correspond to those of timing diagram 600. At the start of timing diagram 700, the PDA mode of the DRAM device is already enabled—e.g. per the techniques illustrated in timing diagram 600.

The memory controller may issue a command to program the memory device to disable the PDA mode. Programming of the DRAM device to disable the PDA mode may include the memory controller issuing some set of signals MRS 710—e.g. to write a value "0" to the mode register bit MR3[4] discussed with respect to timing diagram 600. One or more other signals may be exchanged to facilitate such programming. By way of illustration and not limitation, the ODT signal may be asserted to initiate a transition the DRAM device from RTT_PARK to RTT_NOM for reading signals provided to the DRAM device via a data bus. In an embodiment, the ODT signal is timed—e.g. asserted prior to MRS 710—to account for DODTLon.

The memory controller may provide one or more additional signals via the data bus for executing the command indicated by MRS 710. In an embodiment memory controller may—e.g. after a delay of AL+CWL—begin cycling differential data strobe signals DQS_c, DQS_t to indicate to the DRAM device that one or more data bus lines carry valid signals which are relevant to processing the command indicated by MRS 710. Since it is in PDA mode, the DRAM device may, in response to DQS_c, DQS_t, evaluate DQ0 as a condition for determining whether to execute the command indicated by MRS 710, or forego such execution. If the DRAM device is meant to perform such execution, the memory controller may assert a signal—e.g. logic low ("0")—to indicate such on a data bus signal line which couples to external contact DQ0 of the DRAM device. The asserted signal of DQ0 may serve as an analog for addressing the DRAM device which, for example, enables programmability of one or more features of the DRAM device. The asserting of the signal on DQ0 may be timed to account for latency tPDA_S. In an embodiment, the DRAM device completes its transition from RTT_PARK to RTT_NOM in time for the DRAM device to read signals of DQ0 and any other data bus signal line coupled to the DRAM device.

In the illustrative case shown in timing diagram 700, the memory controller operates in a burst length eight (8) mode, where data bus signals associated with the command for MRS 710 are provided over eight cycles of CK_c, CK_t. The memory controller may prepare in advance for the end of such eight cycles—e.g. where the ODT signal is deasserted for the DRAM device to transition back from RTT_NOM to RTT_PARK. Deasserting the ODT signal may, for example, be timed to account for the DODTLoff. Alternatively or in addition, DQ0 may be deasserted in time for it to reach a logic high state just at the end of the eight clock cycles. For example, deassertion of DQ0 may be timed to account for tPDA_H.

After receiving signals for the command of MRS 710 via data bus signal lines, the DRAM device may execute the command—e.g. to program one or more features of the DRAM device. For example, execution of the command for MRS 710 may write to MR3[A4] (or other such PDA mode location) a value specifying that the PDA mode is disabled in the DRAM device. The memory controller may subsequently issue some valid command 720 for the DRAM device to process—e.g. after minimum delay tMOD_PDA.

Figure 8:
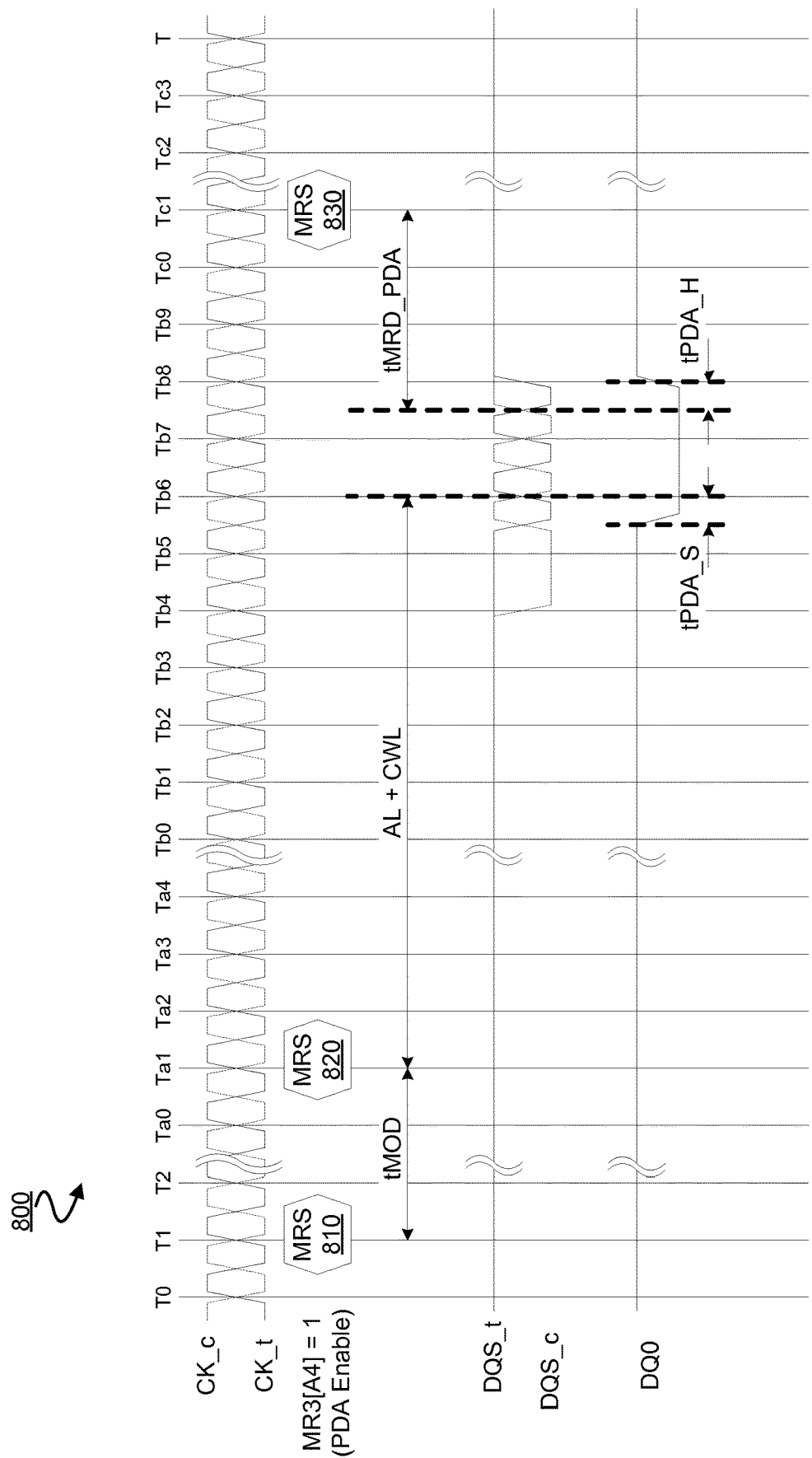
FIG. 8 is a timing diagram illustrating elements of exchanges to program a DRAM device according to an embodiment.

FIG. 8 illustrates elements of a timing diagram 800 for programming a DRAM device according to an embodiment. Timing diagram 800 may represent an illustrative exchange between memory controller 105 and DRAM device 140, for example. The exchanges of timing diagram 800 may, for example, represent an alternative to the exchanges of timing diagram 600, in which the memory controller exchanges data in a burst chop (BC) mode for transmitting data over four (4) cycles of differential clock signals CK_c, CK_t.

To illustrate certain features of different embodiments, timing diagram 800 shows differential clock signals CK_c, CK_t, differential data strobe signals DQS_t and DQS_c, and a DQ0 signal corresponding to those of timing diagram 600. At the start of timing diagram 800, the PDA mode of the DRAM device is disabled. In an embodiment, the memory controller may issue a set of signals MRS 810—including some or all of the features of MRS 610—to enable a PDA mode of the DRAM device. After enabling such a PDA mode, the memory controller may further issue a set of signals MRS 820—including some or all of the features of MRS 620—to program one or more features of the DRAM device. For example, MRS 820 may be issued only after some minimum delay tMOD subsequent to the issuing of MRS 810.

In an embodiment memory controller may—e.g. after a delay of AL+CWL—begin cycling differential data strobe signals DQS_c, DQS_t to indicate to the DRAM device that one or more data bus lines carry valid signals which are relevant to processing the command indicated by MRS 820. Since it is in PDA mode, the DRAM device may, in response to DQS_c, DQS_t, evaluate DQ0 as a condition for determining whether to execute the command indicated by MRS 820, or forego such execution. Such evaluation of DQ0 may correspond to that of DQ0 in timing diagram 600, except that DQ0 for timing diagram 800—due to the memory controller operating in BC mode—remains low for only four cycles of differential clock signals CK_c, CK_t.

After receiving signals for the command of MRS 820 via data bus signal lines, the DRAM device may execute the command—e.g. to program one or more features of the DRAM device. For example, execution of the command for MRS 820 may write to one or more mode registers of the DRAM device to associate a resistance value with an on-die termination setting, to associate a voltage value with a Vref parameter and/or the like. The memory controller may subsequently issue MRS 830 for another command to be processed by the DRAM device—e.g. where MRS 830 is issued only after minimum delay tMOD_PDA.

Figure 9B:
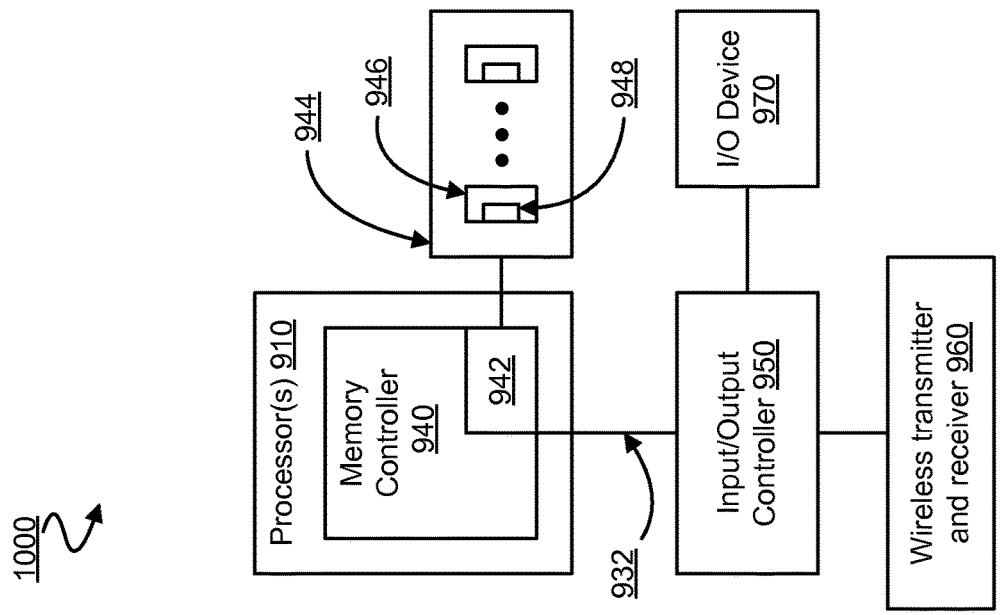
FIG. 9B is a block diagram illustrating elements of a computing system to provide per-DRAM addressability according to an embodiment.
Figure 9A:
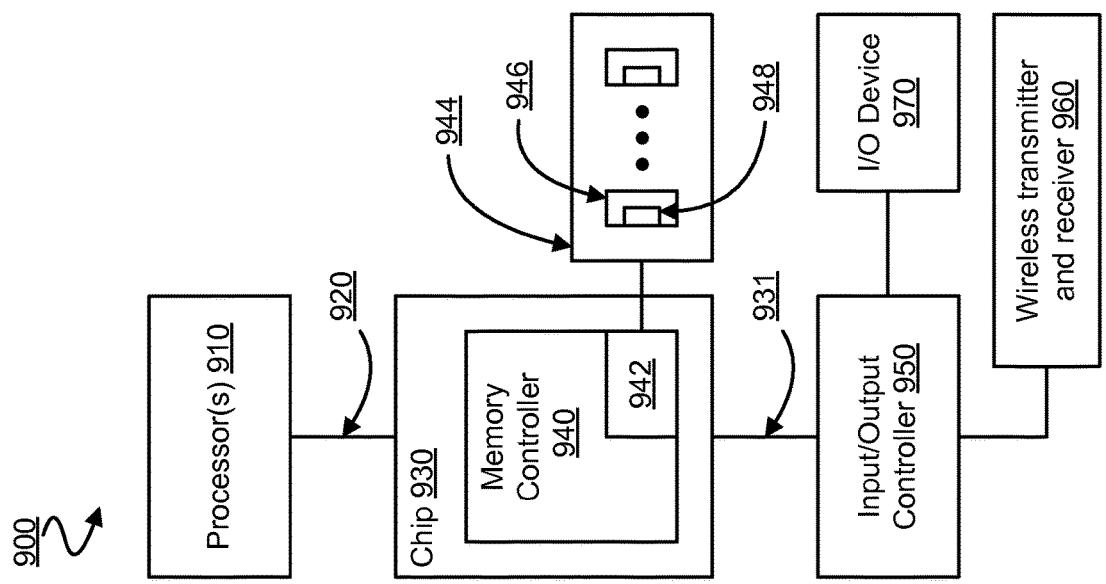
FIG. 9A is a block diagram illustrating elements of a computing system to provide per-DRAM addressability according to an embodiment.

FIGS. 9A and 9B are block diagrams illustrating, respectively, selected aspects of computing systems 900 and 1000. Computing system 900 includes processor 910 coupled with an interconnect 920. In some embodiments, the term processor and central processing unit (CPU) may be used interchangeably. In one embodiment, processor 910 is a processor in the XEON™ family of processors available from Intel Corporation of Santa Clara, Calif. In an alternative embodiment, other processors may be used. In yet another alternative embodiment, processor 910 may include multiple processor cores.

In one embodiment, chip 930 is a component of a chipset. Interconnect 920 may be a point-to-point interconnect or it may be connected to two or more chips (e.g., of the chipset). Chip 930 includes memory controller 940 which may be coupled with main system memory (e.g., as shown in FIG. 1). In an alternative embodiment, memory controller 940 may be on the same chip as processor 910 as shown in FIG. 9B.

Memory system 944 may provide main memory for computing system 900 (and computing system 1000). In some embodiments, each memory device 946 within a rank of memory system 944 includes control logic 948. Control logic 948 may enables memory device 946 to operate in a PDA mode, as discussed herein. In addition, memory controller 940 may include access logic 942. In some embodiments, access logic 942 enables memory controller 940 to configure one or each memory device 946 within the rank to operate in a respective PDA mode. Access logic 942 may further provide device-specific programming of an individual memory device 946, as discussed herein.

Input/output (I/O) controller 950 controls the flow of data between processor 910 and one or more I/O interfaces (e.g., wired and wireless network interfaces) and/or I/O devices. For example, in the illustrated embodiment, I/O controller 950 controls the flow of data between processor 910 and wireless transmitter and receiver 960. In an alternative embodiment, memory controller 940 and I/O controller 950 may be integrated into a single controller. I/O controller 950 may be coupled to chipset 930 via an interconnect 931, for example. Computing system 900 may further include an I/O device 970 coupled directly or indirectly to I/O controller 950 to provide input/output exchanges with a user. For example, I/O device 970 may include one or more of a keyboard, a mouse, a trackball, a pen, a touch screen, a display, a monitor, a speaker, a printer and/or the like.

In one aspect, a dynamic random access memory (DRAM) device comprises a memory array, an external contact to couple the DRAM device to a signal line of a data bus, and a mode register to store a value specifying whether a per-DRAM addressability (PDA) mode of the DRAM device is enabled. The DRAM device further comprises control logic coupled to the mode register, wherein, while the PDA mode of the DRAM device is enabled, the control logic is to condition programmability of one or more features of the DRAM device upon detection of a signal received via the external contact.

In an embodiment, the control logic to condition programmability of the one or more features includes the control logic to select, based on the detection of the signal, between executing a received command and foregoing execution of the received command. In an embodiment, the control logic to condition programmability of the one or more features includes the control logic to condition execution of any mode register set command.

In an embodiment, the DRAM device is a DDR4 SDRAM device. In an embodiment, the DRAM device is a LPDDR4 SDRAM device. In an embodiment, the programmability of the one or more features includes a programmability of an on-die termination parameter. In an embodiment, the programmability of the one or more features includes a programmability of a voltage reference parameter.

In another aspect, a memory controller device comprises a data interface to couple the memory controller device via a signal line of a data bus to an external contact of a dynamic random access memory (DRAM) device. The memory controller further comprises memory access logic to store in a mode register of the DRAM device a value specifying whether a per-DRAM addressability (PDA) mode of the DRAM device is enabled. The memory access logic is further to send a signal via the data interface to the external contact while the PDA mode of the DRAM device is enabled, the signal to specify whether one or more features of the DRAM device are programmable.

In an embodiment, in response to the signal, the DRAM device selects between executing a received command and foregoing execution of the received command. In an embodiment, while the PDA mode of the DRAM device is enabled, the memory access logic is further to provide device-specific programming of an on-die termination parameter of the DRAM device. In an embodiment, while the PDA mode of the DRAM device is enabled, the memory access logic is further to provide device-specific programming of a voltage reference parameter of the DRAM device. In an embodiment, the DRAM device is a DDR4 SDRAM device. In an embodiment, the DRAM device is a LPDDR4 SDRAM device. In an embodiment, the memory controller is integrated in an integrated circuit with a processor.

In an embodiment, the memory controller further comprises a command interface to couple to both the DRAM device and to another DRAM device, wherein the memory access logic is further to send a command signal via the command interface to the DRAM device and the other DRAM device. The memory access logic is further to send via the data interface a first signal for the DRAM device to execute a command indicated by the command signal, and is to send via the data interface a second signal for the other DRAM device to forego execution of any command indicated by the command signal.

In one aspect, a method is performed at a memory controller, the method comprising storing a value in a mode register of a dynamic random access memory (DRAM) device, the value specifying whether a per-DRAM addressability (PDA) mode of the DRAM device is enabled, wherein an external contact of the DRAM device is coupled to the memory controller device via a signal line of a data bus. The method further comprises sending a signal to the external contact while the PDA mode of the DRAM device is enabled, the signal to specify whether one or more features of the DRAM device are programmable.

In an embodiment, in response to the signal, the DRAM device selects between executing a received command and foregoing execution of the received command. In an embodiment, the method further comprises, while the PDA mode of the DRAM device is enabled, providing device-specific programming of an on-die termination parameter of the DRAM device. In an embodiment, the method further comprises, while the PDA mode of the DRAM device is enabled, providing device-specific programming of a voltage reference parameter of the DRAM device. In an embodiment, the DRAM device is a DDR4 SDRAM device. In an embodiment, the DRAM device is a LPDDR4 SDRAM device. In an embodiment, the memory controller is integrated in an integrated circuit with a processor.

In an embodiment, the method further comprises sending a command signal via a command bus to the DRAM device and to another DRAM device, sending via the data bus a first signal for the DRAM device to execute a command indicated by the command signal, and sending via the data bus a second signal for the other DRAM device to forego execution of any command indicated by the command signal.

In one aspect, a system comprises a data bus and a dynamic random access memory (DRAM) device including a memory array, an external contact to couple the DRAM device to a signal line of the data bus and a mode register. The DRAM device further comprises control logic coupled to the mode register, wherein, while a per-DRAM addressability (PDA) mode of the DRAM device is enabled, the control logic to condition programmability of one or more features of the DRAM device upon detection of a signal received via the external contact. The system further comprises a memory controller including a data interface coupled via the signal line to the external contact, and memory access logic to store in the mode register a value specifying whether the PDA mode of the DRAM device is enabled, the memory access logic further to send the signal to the external contact.

In an embodiment, in response to the signal, the DRAM device is to select between executing a received command and foregoing execution of the received command. In an embodiment, while the PDA mode of the DRAM device is enabled, the memory access logic is further to provide device-specific programming of an on-die termination parameter of the DRAM device. In an embodiment, while the PDA mode of the DRAM device is enabled, the memory access logic is further to provide device-specific programming of a voltage reference parameter of the DRAM device. In an embodiment, the DRAM device is a DDR4 SDRAM device. In an embodiment, the memory controller is integrated in an integrated circuit with a processor.

In an embodiment, the memory controller further comprises a command interface to couple to both the DRAM device and to another DRAM device, wherein the memory access logic is further to send a command signal via the command interface to the DRAM device and the other DRAM device, to send via the data interface a first signal for the DRAM device to execute a command indicated by the command signal, and to send via the data interface a second signal for the other DRAM device to forego execution of any command indicated by the command signal.

In another aspect, a method comprises fabricating a memory controller device of an integrated circuit, the memory controller including a data interface to couple the memory controller device via a signal line of a data bus to an external contact of a dynamic random access memory (DRAM) device. The memory controller further comprises memory access logic to store in a mode register of the DRAM device a value specifying whether a per-DRAM addressability (PDA) mode of the DRAM device is enabled. The memory access logic is further to send a signal via the data interface to the external contact while the PDA mode of the DRAM device is enabled, the signal to specify whether one or more features of the DRAM device are programmable.

In an embodiment, in response to the signal, the DRAM device selects between executing a received command and foregoing execution of the received command. In an embodiment, while the PDA mode of the DRAM device is enabled, the memory access logic is further to provide device-specific programming of a voltage reference parameter of the DRAM device. In an embodiment, the memory controller further comprises a command interface to couple to both the DRAM device and to another DRAM device, wherein the memory access logic is further to send a command signal via the command interface to the DRAM device and the other DRAM device. The memory access logic is further to send via the data interface a first signal for the DRAM device to execute a command indicated by the command signal, and is to send via the data interface a second signal for the other DRAM device to forego execution of any command indicated by the command signal.

In one aspect, a system comprises a synchronous dynamic random access memory (SDRAM) device, the SDRAM device including a memory array, and a mode register to hold at least one mode register bit, the value of the at least one mode register bit to determine whether a per-DRAM addressability mode is enabled wherein one or more features of the SDRAM device can be programmed if the SDRAM device is in the per DRAM addressability mode. The system further comprises a memory controller coupled with the SDRAM device, the memory controller including command and control logic capable to issue a command to transition the SDRAM device to a per-DRAM addressability mode.

In an embodiment, the memory controller further includes command and control logic to program an on-die termination value for the SDRAM device. In an embodiment, the memory controller further includes command and control logic to program a voltage reference (Vref) for the SDRAM device. In an embodiment, the SDRAM device is a DDR4 SDRAM device. In an embodiment, the SDRAM device is a LPDDR4 SDRAM device.

In one aspect, a SDRAM device comprises a memory array, command decoder logic to receive and decode commands from a memory controller, and a mode register to hold at least one mode register bit, the value of the at least one mode register bit to determine whether a per DRAM addressability mode is enabled, wherein one or more features of the SDRAM device can be programmed if the SDRAM device is in the per DRAM addressability mode.

In an embodiment, the mode register can be programmed with a device specific on-die termination value if the per DRAM addressability mode is enabled. In an embodiment, the mode register can be programmed with a device specific voltage reference (Vref) value if the per DRAM addressability mode is enabled. In an embodiment, the SDRAM device is a LPDDR4 SDRAM device.

In one aspect, a memory controller comprises an input/output interface to couple the memory controller to one or more synchronous dynamic random access memory devices (SDRAMs), and command and control logic capable to issue a command to transition a synchronous dynamic random access memory (SDRAM) device to a per DRAM addressability mode.

In an embodiment, the memory controller is integrated onto the same integrated circuit as a processor. In an embodiment, the memory controller further includes command and control logic to program an on-die termination value for the SDRAM device. In an embodiment, the memory controller further includes command and control logic to program a voltage reference (Vref) for the SDRAM device. In an embodiment, the memory controller is capable of controlling a DDR4 compliant SDRAM device.

Techniques and architectures for operating a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of methods and symbolic representations of operations on data bits within a computer memory. These methods and representations are the means used by those skilled in the computing arts to most effectively convey the substance of their work to others skilled in the art. A method is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The methods and displays presented herein are not inherently related to any particular computer or other apparatus.

Various general purpose systems may be used with programs in accordance with the teachings herein, or it may prove convenient to construct more specialized apparatus to perform the required method operations. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A dynamic random access memory (DRAM) device comprising:
   a memory array;
   an external contact to couple the DRAM device to a signal line DQ0 of a data bus;
   a mode register to store a value to indicate whether a per-DRAM addressability (PDA) mode of the DRAM device is enabled, the PDA mode to indicate that only selected DRAMs of a rank of multiple DRAMs are to process a command to make changes to a configuration setting, wherein the rank of multiple DRAMs includes the multiple DRAMs in parallel which all execute memory access commands in parallel when PDA mode is not enabled, wherein as a condition to a change of the value to enable the PDA mode the DRAM device is to perform write leveling; and
   control logic coupled to the mode register, wherein, while the PDA mode of the DRAM device is enabled, the control logic is to condition programmability of one or more features of the DRAM device upon detection of a signal received via DQ0, including to select between execution of a received command and forego execution of the received command based on a logic value of the signal received via DQ0, wherein the control logic is to sample DQ0 during a sequence of a burst of data strobe signals to determine the logic value, wherein the sample is to be after a first rising edge of the burst of data strobe signals, on either a first falling edge or on a second rising edge of the burst of data strobe signals.

2. The DRAM device of claim 1, wherein the DRAM device includes a DDR4 SDRAM device.

3. The DRAM device of claim 1, wherein the DRAM device includes a LPDDR4 SDRAM device.

4. The DRAM device of claim 1, wherein the programmability of the one or more features includes a programmability of an on-die termination parameter.

5. The DRAM device of claim 1, wherein the programmability of the one or more features includes a programmability of a voltage reference parameter.

6. The DRAM device of claim 1, wherein dynamic ODT is not supported when the DRAM device is in the PDA mode, and wherein the control logic to condition programmability of the one or more features further includes the control logic to assert on-die termination as a condition to sample the signal line.

7. A memory controller device comprising:
   a data interface to couple the memory controller device via a signal line DQ0 of a data bus to an external contact of a dynamic random access memory (DRAM) device; and
   memory access logic to store in a mode register of the DRAM device a value to indicate whether a per-DRAM addressability (PDA) mode of the DRAM device is enabled and to trigger the DRAM device to perform write leveling as a condition to store the value to enable the PDA mode, the PDA mode to indicate that only selected DRAMs of a rank of multiple DRAMs are to process a command to make changes to a configuration setting, wherein the rank of multiple DRAMs includes the multiple DRAMs in parallel which all execute memory access commands in parallel when PDA mode is not enabled, the memory access logic further to send a signal via DQ0 while the PDA mode of the DRAM device is enabled, the signal to specify whether one or more features of the DRAM device are programmable, wherein the signal causes the DRAM to select between execution of a command sent from the memory controller and forego execution of the command based on a logic value of the signal sent via DQ0, wherein the DRAM is to sample DQ0 during a sequence of a burst of data strobe signals to determine the logic value, wherein the sample is to be after a first rising edge of the burst of data strobe signals, on either a first falling edge or on a second rising edge of the burst of data strobe signals.

8. The memory controller device of claim 7, wherein, while the PDA mode of the DRAM device is enabled, the memory access logic further to provide device-specific programming of an on-die termination parameter of the DRAM device.

9. The memory controller device of claim 7, wherein, while the PDA mode of the DRAM device is enabled, the memory access logic further to provide device-specific programming of a voltage reference parameter of the DRAM device.

10. The memory controller device of claim 7, wherein the DRAM device includes a DDR4 SDRAM device.

11. The memory controller device of claim 7, wherein the DRAM device includes a LPDDR4 SDRAM device.

12. The memory controller device of claim 7, wherein the memory controller is integrated in an integrated circuit with a processor.

13. The memory controller device of claim 7, wherein dynamic ODT is not supported when the DRAM device is in the PDA mode, and wherein the memory access logic is further to assert on-die termination at the memory device as a condition to send the signal.

14. A method at a memory controller device, the method comprising:
   storing a value in a mode register of a dynamic random access memory (DRAM) device, the value specifying whether a per-DRAM addressability (PDA) mode of the DRAM device is enabled, wherein an external contact of the DRAM device is coupled to the memory controller device via a signal line DQ0 of a data bus, the PDA mode indicating that only selected DRAMs of a rank of multiple DRAMs are to process a command to make changes to a configuration setting, wherein the rank of multiple DRAMs includes the multiple DRAMs in parallel which all execute memory access commands in parallel when PDA mode is not enabled;

triggering the DRAM device to perform write leveling as a condition to storing the value to enable the PDA mode; and sending a signal via DQ0 while the PDA mode of the DRAM device is enabled, the signal to specify whether one or more features of the DRAM device are programmable, wherein sending the signal causes the DRAM to select between executing a subsequent command sent from the memory controller and foregoing execution of the command based on a logic value of the signal received via DQ0, wherein the DRAM is to sample DQ0 during a sequence of a burst of data strobe signals to determine the logic value, wherein the sample is to be after a first rising edge of the burst of data strobe signals, on either a first falling edge or on a second rising edge of the burst of data strobe signals.

15. The method of claim 14, further comprising:
while the PDA mode of the DRAM device is enabled, providing device-specific programming of an on-die termination parameter of the DRAM device.

16. The method of claim 14, further comprising:
while the PDA mode of the DRAM device is enabled, providing device-specific programming of a voltage reference parameter of the DRAM device.

17. The method of claim 14, wherein the DRAM device includes a DDR4 SDRAM device.

18. The method of claim 14, wherein the DRAM device includes a LPDDR4 SDRAM device.

19. The method of claim 14, wherein the memory controller is integrated in an integrated circuit with a processor.

20. The method of claim 14, wherein dynamic ODT is not supported when the DRAM device is in the PDA mode, and further comprising:
asserting on-die termination at the memory device as a condition to sending the signal.

21. A system comprising:
a data bus;
dynamic random access memory (DRAM) device including:
a memory array;
an external contact to couple the DRAM device to a signal line DQ0 of the data bus;
a mode register; and
control logic coupled to the mode register, wherein, while a per-DRAM addressability (PDA) mode of the DRAM device is enabled, wherein the DRAM device is to perform write leveling as a condition to enable the PDA mode, the control logic to condition programmability of one or more features of the DRAM device upon detection of a signal received via the external contact, the PDA mode to indicate that only selected DRAMs of a rank of multiple DRAMs are to process a command to make changes to a configuration setting, wherein the rank of multiple DRAMs includes the multiple DRAMs in parallel which all execute memory access commands in parallel when PDA mode is not enabled, the control logic to select between execution of a received command and forego execution of the received command based on a logic value of the signal received via DQ0, wherein the control logic is to sample DQ0 during a sequence of a burst of data strobe signals to determine the logic value, wherein the sample is to be after a first rising edge of the burst of data strobe signals, on either a first falling edge or on a second rising edge of the burst of data strobe signals; and a memory controller including:
a data interface coupled via the signal line to the external contact; and
memory access logic to store in the mode register a value to specify whether the PDA mode of the DRAM device is enabled, the memory access logic further to send the signal to the external contact.

22. The system of claim 21, wherein, while the PDA mode of the DRAM device is enabled, the memory access logic further to provide device-specific programming of an on-die termination parameter of the DRAM device.

23. The system of claim 21, wherein, while the PDA mode of the DRAM device is enabled, the memory access logic further to provide device-specific programming of a voltage reference parameter of the DRAM device.

24. The system of claim 21, wherein the DRAM device includes a DDR4 SDRAM device.

25. The system of claim 21, wherein the memory controller is integrated in an integrated circuit with a processor.

26. The system of claim 21, wherein dynamic ODT is not supported when the DRAM device is in the PDA mode, and wherein the control logic is to assert on-die termination as a condition to sample the signal line.

27. A system comprising:
a synchronous dynamic random access memory (SDRAM) device, the SDRAM device including:
a memory array,
a data bus, and
a mode register to hold at least one mode register bit to determine whether a per DRAM addressability (PDA) mode is enabled wherein one or more features of the SDRAM device are to be programmable with mode register configuration commands separately from other SDRAM device of a rank of multiple SDRAM devices when the SDRAM device is in the PDA mode; and
a memory controller coupled with the SDRAM device, the memory controller including command and control logic capable to issue a command to transition the SDRAM device to a PDA mode,
wherein the SDRAM device is to perform write leveling as a condition for entry to the PDA mode,
wherein when the PDA mode is enabled, the SDRAM to determine a logic value of a bit on the data bus to select between execution of a subsequent command sent from the memory controller and forego execution of the subsequent command, wherein dynamic ODT is not supported when the SDRAM device is in the PDA mode, and wherein the SDRAM device is to assert on-die termination prior to sample the bit on the data bus.

28. The system of claim 27, wherein the memory controller further includes command and control logic to program an on-die termination value for the SDRAM device or a voltage reference (Vref) for the SDRAM device.

29. The system of claim 27, wherein the SDRAM device includes a DDR4 SDRAM device.

30. The system of claim 27, wherein the SDRAM device includes a LPDDR4 SDRAM device.

31. The system of claim 27, wherein the mode register is one of multiple mode registers, wherein in PDA mode, mode register configuration commands are only sent to other mode registers that are not the one mode register.

32. A synchronous dynamic random access memory (SDRAM) device, the SDRAM device comprising:
- a memory array;
- a data bus;
- command decoder logic to receive and decode commands from a memory controller; and
- a mode register to hold at least one mode register bit to determine whether a per DRAM addressability (PDA) mode is enabled wherein one or more features of the SDRAM device are to be programmable with mode register configuration commands separately from other SDRAM device of a rank of multiple SDRAM devices when the SDRAM device is in the PDA mode;
- wherein the SDRAM device is to perform write leveling as a condition for entry to the PDA mode;
- wherein when the PDA mode is enabled, the SDRAM to determine a logic value of a bit on the data bus to select between execution of a subsequent command sent from the memory controller and forego execution of the command, wherein dynamic ODT is not supported when the SDRAM device is in the PDA mode, and wherein the SDRAM device is to assert on-die termination prior to sample the the bit on the data bus.

33. The SDRAM device of claim 32, wherein the mode register configuration commands include a command to set a device specific on-die termination value or a device specific voltage reference (Vref) value when the PDA mode is enabled.

34. The SDRAM device of claim 32, wherein the SDRAM device includes a LPDDR4 SDRAM device.

35. The SDRAM device of claim 32, wherein the mode register is one of multiple mode registers, wherein in PDA mode, mode register configuration commands are only sent to other mode registers that are not the one mode register.

36. A memory controller comprising:
- an input/output interface to couple the memory controller to a rank of multiple synchronous dynamic random access memory SDRAM devices; and
- command and control logic configured to issue a command to cause a selected SDRAM device of the multiple SDRAM devices to enter a per DRAM addressability (PDA) mode including to trigger the selected SDRAM device to perform write leveling as a condition for entry into the PDA mode, wherein only the selected SDRAM device of the rank is to process a command to make changes to a configuration setting when in the PDA mode,
- wherein when the PDA mode is enabled, the selected SDRAM device to determine a logic value of a bit on a data bus to select between execution of a subsequent command sent from the memory controller and forego execution of the command, wherein dynamic ODT is not supported when the SDRAM device is in the PDA mode, and wherein the SDRAM device is to assert on-die termination prior to sample the bit on the data bus.

37. The memory controller of claim 36, wherein the memory controller is integrated onto a common integrated circuit with a processor.

38. The memory controller of claim 36, wherein the memory controller further includes command and control logic to program an on-die termination value for the SDRAM device or a voltage reference (Vref) for the SDRAM device.

39. The memory controller of claim 36, wherein the SDRAM includes a DDR4 compliant SDRAM device.

40. The memory controller of claim 36, wherein the command and control logic is to issue a command to one of multiple mode registers to transition to PDA mode, and wherein when SDRAM is in PDA mode, the command and control logic is to issue mode register configuration commands only to other mode registers that are not the one mode register.

* * * * *